US007115927B2

(12) United States Patent
Hideki et al.

(10) Patent No.: US 7,115,927 B2
(45) Date of Patent: Oct. 3, 2006

(54) PHASE CHANGEABLE MEMORY DEVICES

(75) Inventors: Horii Hideki, Seoul (KR); Jeong-hee Park, Gyeonggi-do (KR)

(73) Assignee: Samsung Electronics Co., Ltd., (KR)

( * ) Notice: Subject to any disclaimer, the term of this patent is extended or adjusted under 35 U.S.C. 154(b) by 113 days.

(21) Appl. No.: 10/781,597

(22) Filed: Feb. 18, 2004

(65) Prior Publication Data

US 2004/0165422 A1 Aug. 26, 2004

(30) Foreign Application Priority Data

Feb. 24, 2003 (KR) .................... 10-2003-0011416

(51) Int. Cl.
*H01L 27/108* (2006.01)
*H01L 29/76* (2006.01)
*H01L 29/94* (2006.01)
*H01L 31/119* (2006.01)
*H01L 29/02* (2006.01)

(52) U.S. Cl. .............. 257/296; 257/2; 257/3; 257/4; 257/202; 257/211; 257/246; 257/247; 257/248; 257/257; 257/298; 257/758

(58) Field of Classification Search ............... 257/2–4, 257/202, 211, 257, 296, 298, 758, 246–248
See application file for complete search history.

(56) References Cited

U.S. PATENT DOCUMENTS

| | | | | |
|---|---|---|---|---|
| 4,924,436 A | * | 5/1990 | Strand .................... 365/113 |
| 5,166,758 A | * | 11/1992 | Ovshinsky et al. ............. 257/3 |
| 5,714,768 A | * | 2/1998 | Ovshinsky et al. ............ 257/40 |
| 5,811,816 A | * | 9/1998 | Gallagher et al. ...... 250/370.15 |
| 6,258,062 B1 | * | 7/2001 | Thielen et al. .............. 604/141 |
| 6,381,967 B1 | * | 5/2002 | Craig .......................... 62/64 |
| 6,437,383 B1 | * | 8/2002 | Xu ............................. 257/300 |
| 6,507,061 B1 | * | 1/2003 | Hudgens et al. ............. 257/295 |
| 6,759,267 B1 | * | 7/2004 | Chen ........................... 438/95 |
| 6,774,388 B1 | * | 8/2004 | Hudgens et al. ............... 257/3 |
| 6,858,277 B1 | | 2/2005 | Yamada et al. |
| 6,919,578 B1 | * | 7/2005 | Lowrey et al. ................ 257/4 |
| 7,037,762 B1 | * | 5/2006 | Joo et al. .................... 438/128 |
| 2002/0081804 A1 | * | 6/2002 | Gill et al. .................... 438/257 |
| 2004/0115945 A1 | * | 6/2004 | Lowrey et al. ............. 438/700 |

FOREIGN PATENT DOCUMENTS

JP 10340489 A * 12/1998
KR 2001-0111276 A 2/2005

OTHER PUBLICATIONS

Notice to File Response/Amendment to the Examination Report, Korean App. No. 10-2004-0012358, Dec. 21, 2005.

* cited by examiner

*Primary Examiner*—Ida M. Soward
(74) *Attorney, Agent, or Firm*—Myers Bigel Sibley & Sajovec, P.A.

(57) ABSTRACT

Phase-changeable memory devices and method of fabricating phase-changeable memory devices are provided that include a phase-changeable material pattern of a phase-changeable material that includes nitrogen atoms. First and second electrodes are electrically connected to the phase-changeable material pattern and provide an electrical signal thereto. The phase-changeable material pattern may have a polycrystalline structure.

27 Claims, 13 Drawing Sheets

PHASE CHANGEABLE MEMORY DEVICES

CLAIM OF PRIORITY

This application claims priority from Korean Patent Application No. 2003-11416, filed on Feb. 24, 2003, in the Korean Intellectual Property Office, the contents of which are incorporated herein by reference in its entirety.

FIELD OF THE INVENTION

The present invention relates to semiconductor memory devices and more specifically to phase-changeable memory devices and methods of fabricating the same.

BACKGROUND OF THE INVENTION

Semiconductor memory devices are typically categorized into volatile memory devices and non-volatile memory devices depending on whether data can be conserved or not when power is removed from the device. Volatile memory devices include D-RAM devices and S-RAM devices and non-volatile memory devices include flash memory devices. These memory devices, typically, indicate logic "0" or "1" according to the presence of stored charge.

D-RAM (i.e. a volatile memory device) typically requires periodic refresh operations and a high capability for storing charges. Thus, there have been extensive studies on improving a capacitance of the DRAM device. For instance, increasing the surface area of capacitor electrodes may increase the capacitance but the surface area increase of the capacitor electrode may be an obstacle to improved device integrity.

Conventional flash memory cells typically include a gate insulating layer, a floating gate, a dielectric layer and a control gate that are sequentially stacked on the semiconductor substrate. Writing or erasing data into the flash memory cell typically employs tunneling electrons through a gate insulating layer. In this case, the operating voltage may need to be higher than a power supply voltage. Thus, the flash memory devices may need a booster circuit that applies the higher voltage to write or erase data.

Accordingly, new memory devices have been developed, having non-volatile, random access characteristics and a simple structure. Such devices include phase-changeable memory devices. The phase-changeable memory device typically utilizes a phase changeable material that changes crystalline structure thereof depending on the provided heat. Conventionally, the phase-changeable material is a chalcogenide compound including germanium (Ge), antimony (Sb) and tellurium (Te) (i.e., GST or Ge—Sb—Te). When current is applied to the phase-changeable material layer to heat the GST, the crystalline state of a predetermined portion of the GST changes depending on the provided amount and time of the current. The resistance varies according to the state of crystal, such that logical information can be determined by detecting the difference of the resistance. In this case, a crystalline state has low resistance and an amorphous state has high resistance.

If GST is heated up to a melting point (about 610° C.) by applying high current flux to the GST for a short time (1–10 ns) and cooled quickly in a short time (1 ns or less), the heated portion of the GST becomes amorphous (e.g., a reset state). If GST is heated up to maintain a crystalline temperature (about 450° C.) lower than the melting point temperature by applying relatively low current flux for a long time, e.g., about 30–50 ns, (a resistant heating) and cooled down, the heated portion of the GST becomes crystalline (e.g., a set state).

Because the GST formed by conventional thin film deposition has a greater grain size (about 100 nm grains or larger, substantially mono-crystalline state), GST has a very low resistivity (e.g., about 2 mΩcm). Thus, a large amount of current may be required to provide the heat to form the amorphous state. For instance, when 1 mA high current pulse is applied for about 50 ns, a temperature of the GST may only be raised to about 141° C. because the resistivity of the GST is low (about 2 mΩ).

In addition, memory devices may need to be capable of maintaining their operating characteristics in spite of repeated writing operations. That is, it may be desirable for the memory device to have stability in its thermal budget due to repeated write operations. In a conventional memory device, exceeding a thermal budget changes the characteristic of the GST layer to lower the crystallization temperature. Therefore, malfunction may occur in a read operation. For example, when a voltage for a read operation is applied, false logic information may be read because a crystalline state of the GST varies (e.g., the resistance changes).

SUMMARY OF THE INVENTION

Embodiments of the present invention provide phase-changeable memory devices and methods of fabricating phase-changeable memory devices that include a phase-changeable material pattern of a phase-changeable material that includes nitrogen atoms. First and second electrodes are electrically connected to the phase-changeable material pattern and provide an electrical signal thereto. In certain embodiments of the present invention, the phase-changeable material pattern has a polycrystalline structure.

In further embodiments of the present invention, an amount of the nitrogen atoms included in the phase-changeable material is from about 0.25% to about 25% with respect to the total atomic weight of ingredients of the phase-changeable material. The phase-changeable material pattern may be Ge—Sb—Te—N, As—Sb—Te—N, As—Ge—Sb—Te—N, Sn—Sb—Te—N, In—Sn—Sb—Te—N, Ag—In—Sb—Te—N, 5A group element-Sb—Te—N, 6A group element-Sb—Te—N, 5A group element-Sb—Se—N, and/or 6A group element-Sb—Se—N.

In additional embodiments of the present invention, the first and second electrodes are a conductive material containing nitrogen, a conductive material containing carbon, titanium, tungsten, molybdenum, tantalum, titanium silicide, tantalum silicide and/or a combination thereof. The first and/or second conductive electrodes may also further include one of aluminum (Al), aluminum-copper alloy (Al—Cu), aluminum-copper-silicon alloy (Al—Cu—Si), tungsten silicide (WSi), copper (Cu), tungsten titanium (TiW) and/or a combination thereof. The conductive material containing nitrogen may be titanium nitride (TiN), tantalum nitride (TaN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (MoAlN), tantalum silicon nitride (TaSiN), tantalum aluminum nitride (TaAlN), titan oxide nitride (TiON), titanium aluminum oxide nitride (TiAlON), tungsten oxide nitride (WON) and/or tantalum oxide nitride (TaON).

In still further embodiments of the present invention, the phase-changeable memory device further includes a transistor including a source region, a drain region and a gate electrode, a lower interconnection electrically connected to the drain region and an upper metal interconnection electrically connected to one of the first and second electrodes. The other of the first and second electrodes is electrically connected to the source region.

Embodiments of the present invention also provide phase-changeable memory devices and methods of fabricating phase-changeable memory devices that include a phase-changeable material pattern of a phase-changeable material having a polycrystalline structure and first and second electrodes electrically connected to the phase-changeable material pattern to provide an electrical signal thereto. The phase-changeable material pattern may be Ge—Sb—Te—N, As—Sb—Te—N, As—Ge—Sb—Te—N, Sn—Sb—Te—N, In—Sn—Sb—Te—N, Ag—In—Sb—Te—N, a 5A group element-Sb—Te—N, a 6A group element-Sb—Te—N, a 5A group element-Sb—Se—N, and/or a 6A group element-Sb—Se—N. The amount of nitrogen atoms in the phase-changeable material pattern may be from about 0.25% to about 25% with respect to the total atomic weight of ingredients of the phase-changeable material.

Embodiments of the present invention also provide phase-changeable memory devices and methods of fabricating phase-changeable memory devices that include a transistor including a source region, a drain region and a gate electrode disposed on the semiconductor substrate, a lower interconnection electrically connected to the drain region, a contact pad formed of the same material and placed on the same height as the lower interconnection, a variable resistor electrically connected to the contact pad and an upper interconnection electrically connected to the variable resistor. The variable resistor is interposed between the two electrodes and includes nitrogen atoms.

In certain embodiments of the present invention, the variable resistor includes a phase-changeable material pattern having a polycrystalline structure having 100 nm grains or smaller. The variable resistor may also include a phase-changeable material pattern that includes nitrogen atoms. The amount of the nitrogen atoms may be from about 0.25% to about 25% with respect to the total atomic weight of ingredients of the phase-changeable material.

The phase-changeable material pattern may be Ge—Sb—Te—N, As—Sb—Te—N, As—Ge—Sb—Te—N, Sn—Sb—Te—N, In—Sn—Sb—Te—N, Ag—In—Sb—Te—N, a 5A group element-Sb—Te—N, a 6A group element-Sb—Te—N, a 5A group element-Sb—Se—N, and/or a 6A group element-Sb—Se—N. The first and second electrodes may be a conductive material containing nitrogen, a conductive material containing carbon, titanium, tungsten, molybdenum, tantalum, titanium silicide, tantalum silicide and/or a combination thereof. One of the two electrodes may be electrically connected to the contact pad and the other electrode may be electrically connected to the upper interconnection. The other electrode connected to the top electrode may include aluminum (Al), aluminum-copper alloy (Al—Cu), aluminum-copper-silicon alloy (Al—Cu—Si), tungsten silicide (WSi), copper (Cu), tungsten titanium (TiW), and/or a combination thereof. The conductive material containing nitrogen may be titanium nitride (TiN), tantalum nitride (TaN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), silicon aluminum nitride (ZrAlN), molybdenum silicon nitride (MoSiN), molybdenum aluminum nitride (MoAlN), tantalum silicon nitride (TaSiN), tantalum aluminum nitride (TaAlN), titanium oxide nitride (TiON), titanium aluminum oxide nitride (TiAlON), tungsten oxide nitride (WON) and/or tantalum oxide nitride (TaON).

Embodiments of the present invention also provide phase-changeable memory devices and method of fabricating phase-changeable memory devices that include a transistor including a source region, a drain region and a gate electrode that are disposed on the semiconductor substrate, an interlayer dielectric layer formed on the semiconductor substrate to cover the transistor, a lower interconnection disposed in the interlayer dielectric layer to connect to the drain region electrically, a contact pad disposed in the interlayer dielectric layer at substantially the same height and formed of the same material as the lower interconnection, a lower intermetal dielectric layer disposed on the interlayer dielectric layer, a variable resistor electrically connected to the contact pad, an upper intermetal dielectric layer disposed on the lower intermetal dielectric layer to cover a side of the variable resistor and an upper interconnection disposed in the upper intermetal dielectric layer to connect to the variable resistor electrically. The variable resistor includes a bottom electrode penetrating a portion of the lower intermetal dielectric layer to electrically connect to the contact pad, a phase-changeable material pattern containing nitrogen atoms disposed on the lower intermetal dielectric layer and on the bottom electrode and a top electrode disposed on the phase-changeable material pattern to electrically connect to the upper interconnection.

In additional embodiments of the present invention, the phase-changeable material pattern has a polycrystalline structure having 100 nm grains or smaller. The amount of the nitrogen atoms may be about from 0.25% to about 25% with respect to a total atomic weight of ingredients of the phase-changeable material pattern. The phase-changeable material pattern may be Ge—Sb—Te—N, As—Sb—Te—N, As—Ge—Sb—Te—N, Sn—Sb—Te—N, In—Sn—Sb—Te—N, Ag—In—Sb—Te—N, a 5A group element-Sb—Te—N, a 6A group element-Sb—Te—N, a 5A group element-Sb—Se—N, and/or a 6A group element-Sb—Se—N. The bottom and top electrodes may be a conductive material containing nitrogen, a conductive material containing carbon, titanium, tungsten, molybdenum, tantalum, titanium silicide, tantalum suicide, and/or a combination thereof.

In still further embodiments of the present invention, a top surface of the top electrode is lower than a top surface of the upper intermetal dielectric layer. A conductive plug penetrates the intermetal dielectric layer on the top electrode to electrically connect to the upper interconnection, A diameter of the conductive plug is smaller than a width of the top electrode and the conductive plug may be aluminum (Al), aluminum-copper alloy (Al—Cu), aluminum-copper-silicon alloy (Al—Cu—Si), tungsten silicide (WSi), copper (Cu), tungsten titanium (TiW), and/or a combination thereof. The conductive material containing nitrogen may be titanium nitride (TiN), tantalum nitride (TaN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), silicon aluminum nitride (ZrAlN), molybdenum silicon nitride (MoSiN), molybdenum aluminum nitride (MoAlN), tantalum silicon nitride (TaSiN), tantalum aluminum nitride (TaAlN), titanium oxide nitride (TiON), titanium aluminum oxide nitride (TiAlON), tungsten oxide nitride (WON) and/or tantalum oxide nitride (TaON).

DESCRIPTION OF EXEMPLARY EMBODIMENTS OF THE INVENTION

Figure 1:
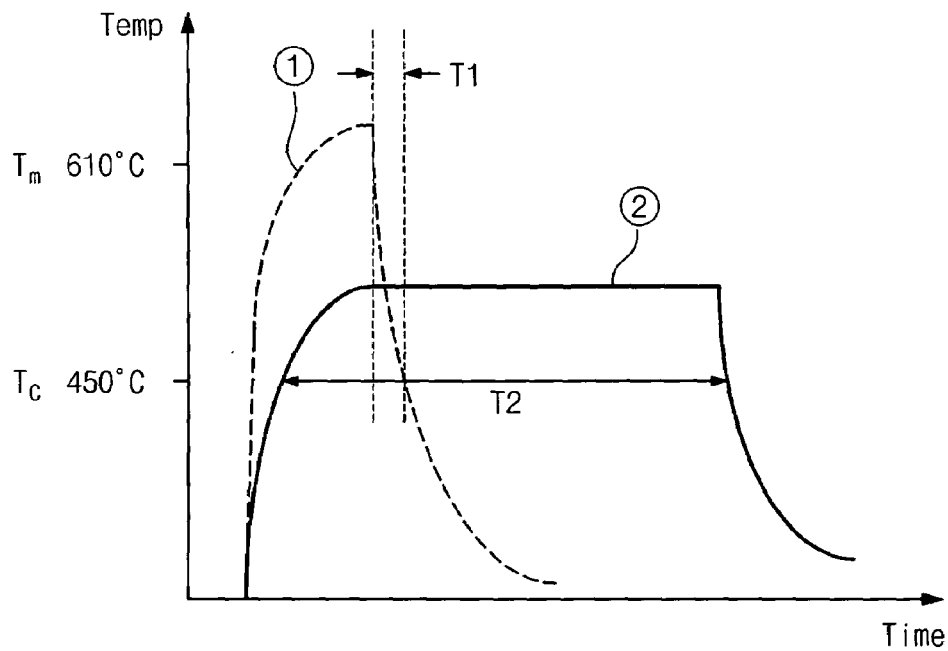
FIG. 1 is a graph showing a writing operation of a phase-changeable memory device.

The present invention will now be described more fully with reference to the accompanying drawings, in which preferred embodiments of the invention are shown. This invention may, however, be embodied in different forms and should not be construed as being limited to the embodiments set forth herein. Rather, these embodiments are provided so that this disclosure will be thorough and complete, and will fully convey the scope of the invention to those skilled in the art. In the drawings, the size or thickness of layers and regions are exaggerated for clarity. Like numbers refer to like elements. As used herein the term "and/or" includes any and all combinations of one or more of the associated listed items.

It will be understood that although the terms first and second may be used herein to describe various regions, layers, and/or sections, these regions, layers, and/or sections should not be limited by these terms. These terms are only used to distinguish one region, layer, or section from another region, layer, or section. Thus, a first region, layer, or section discussed below could be termed a second region, layer, or section, and similarly, a second without departing from the teachings of the present invention.

The phase-changeable memory device, as illustrated in FIG. 1, utilizes phase-changeable materials whose crystalline state is varied between a polycrystalline state and an amorphous state depending on applied heat. That is, when a high current pulse is applied to the phase-changeable materials for a short time, the phase-changeable materials change into an amorphous state (reset state) having a high resistivity, but when a low current plus is applied for a long time, the phase-changeable materials changes into the crystalline state (set state) having a low resistivity. Thus, if the phase-changeable material layer is heated to a temperature higher than a melting point ($T_m$) thereof (a resistor heated by a current pulse) and then cooled for a short time ($T_1$), the phase-changeable material layer becomes amorphous (referring to a curve ①). If the phase-changeable material layer is heated to a temperature lower than the melting temperature ($T_m$) but higher than the crystallization temperature ($T_c$) (a resistor heated by a current pulse), maintained for a specific time T2 longer than $T_1$ and cooled, the phase-changeable material becomes crystalline (referring to a curve ②).

Certain embodiments of the present invention utilize a phase-changeable material having increased resistance over conventional phase-changeable materials, thereby reducing the current pulse required in generating heat to change the crystalline state of the phase-changeable material layer. Such may be the case because the heat generated by the current pulse is proportional to the resistance. In particular embodiments of the present invention, a polycrystalline phase-changeable material layer is provided that includes small grains, e.g., less than about 100 nm. The polycrystalline phase-changeable material layer may also reduce and/or prevent contaminants from penetrating into the phase-changeable material layer because a distance for the contaminant to diffuse increases. For instance, elements of an electrode formed on the phase-changeable material layer that penetrate the phase-changeable material layer during subsequent thermal processes, etc., may be reduced.

The phase-changeable material layer according to certain embodiments of the present invention contains nitrogen atoms. The nitrogen atoms exist not only inside the small grains (inside crystals) but also at the interface of the grains of the polycrystalline phase-changeable material. Due to the nitrogen atoms, the resistivity of the phase-changeable material layer increases, resulting in a decrease of the current pulse required for changing the crystalline state of the phase-changeable material layer. The nitrogen atoms suppress the grain growth of the phase-changeable material, such that the grains of the phase-changeable material layer are small. As the concentration of the nitrogen increases, the size of the crystal decreases. For example, in certain embodiments of the present invention, the phase-changeable material layer has a polycrystalline state having grains less than about 100 nm. In particular embodiments of the present invention, the phase-changeable material layer has a grain size of about 40 nm grains or smaller.

In certain embodiments of the present invention, the phase-changeable material layer contains from about 0.25 to about 25% nitrogen atoms with respect to the total atomic weight of ingredients. The phase-changeable material contains nitrogen atoms and may be anyone of Ge—Sb—Te—N, As—Sb—Te—N, As—Ge—Sb—Te—N, Sn—Sb—Te—N, In—Sn—Sb—Te—N, Ag—In—Sb—Te—N, a 5A group element-Sb—Te—N, 6A group element-Sb—Te—N, 5A group-Sb—Se—N, and/or a 6A group element-Sb—Se—N.

Figure 2:
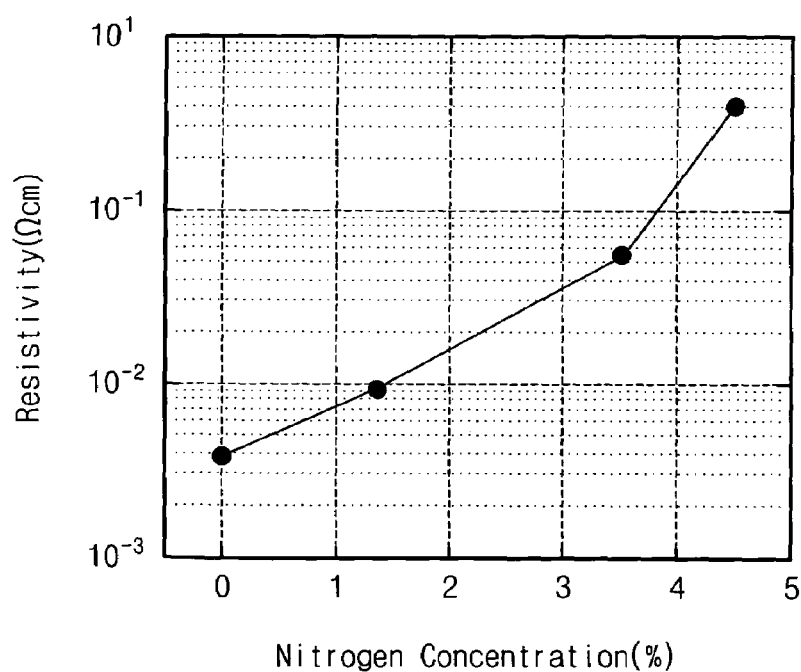
FIG. 2 is a graph showing resistivity of GST containing nitrogen (Ge—Sb—Te—N) according to concentrations of the nitrogen.

FIG. 2 is a graph showing resistivity of GST containing nitrogen atoms (Ge—Sb—Te—N) according to concentrations of the nitrogen. A parallel axis in the FIG. 2 refers to atomic percent of the nitrogen atoms contained in the GST, and a perpendicular axis refers to resistivity (Ωcm). Referring to FIG. 2, the resistivity of the GST increases as the concentration of nitrogen atoms.

Figure 3:
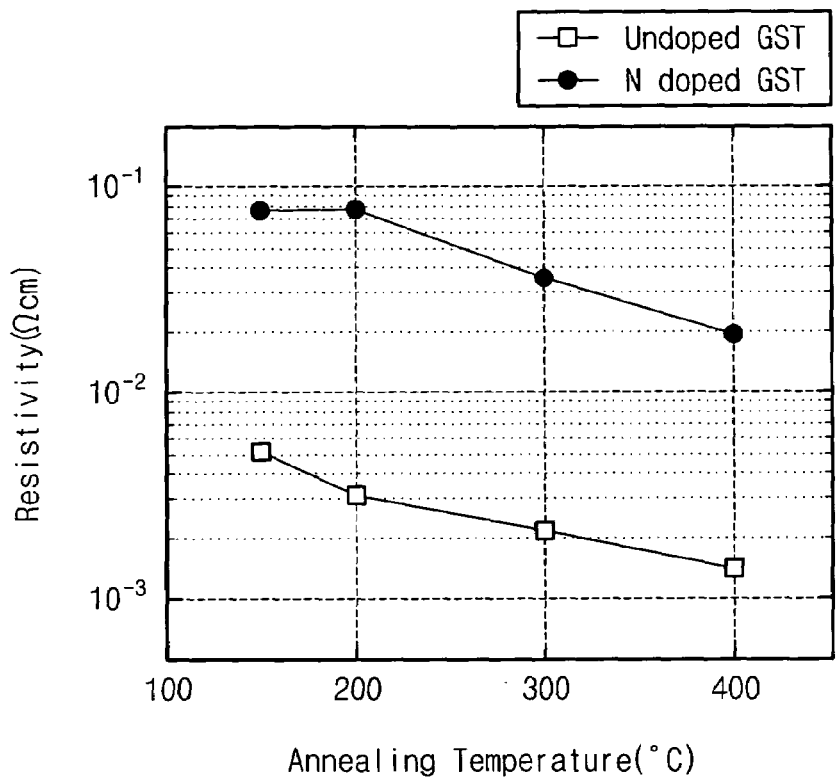
FIG. 3 is a graph showing resistivities of conventional Ge—Sb—Te and Ge—Sb—Te—N according to certain embodiments of the present invention.

FIG. 3 is a graph showing resistivity of conventional Ge—Sb—Te and Ge—Sb—Te—N according to certain embodiments of the present invention according to annealing temperatures. The parallel axis refers to an annealing temperature (° C.), and the perpendicular axis refers to resistivity (Ωcm). In FIG. 3, -●- represents a resistivity of GST containing 7 atomic percent nitrogen and -□- represents a resistivity of conventional GST. Referring to FIG. 3, the resistivity of conventional Ge—Sb—Te reduces to about 2 mΩcm but the resistivity of GST containing 7% nitrogen atoms is measured to be greater that that of conventional GST (about 20 mΩcm). That is, the resistivity of the GST containing nitrogen atoms according to embodiments of the present invention increases about 10 times as high as the conventional one.

Figure 4:
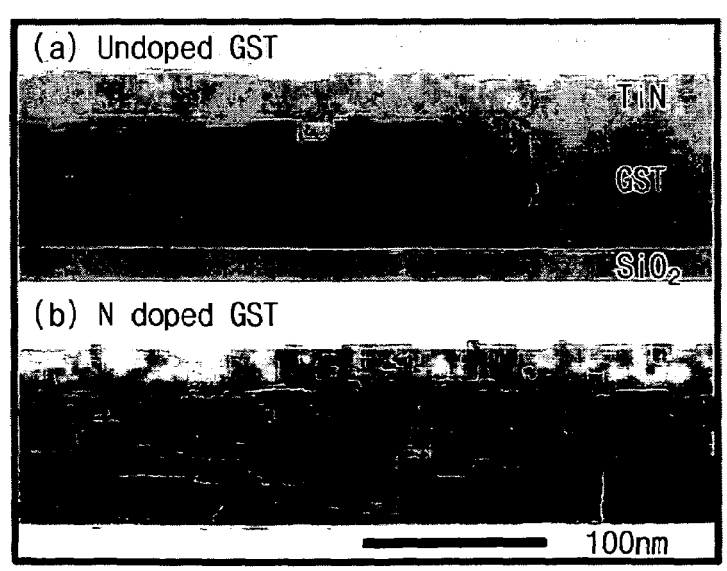
FIG. 4 is a TEM showing a crystalline state of the conventional GST and a crystalline state of the GST containing 7% nitrogen according to certain embodiments of the present invention after 500° C. annealing.

FIG. 4 is a transmission electron spectroscopy (TEM) picture showing a crystalline state of the conventional GST and a crystalline state of the GST containing 7% nitrogen atoms according to certain embodiments of the present invention after 500° C. annealing. The upper TEM picture of FIG. 4 shows a crystalline state of a conventional GST and the lower one shows a crystalline state of GST containing nitrogen atoms according to certain embodiments of the present invention. The pictures show the conventional GST has a mono-crystalline state of which grain size is about more than 100 nm but the GST containing nitrogen has a polycrystalline state of which the grains are about 40 nm or smaller.

Figure 5:
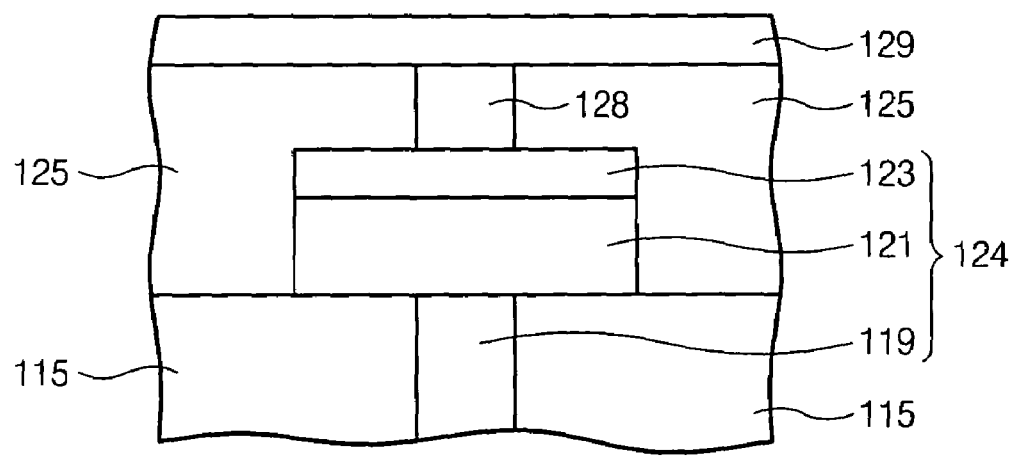
FIG. 5 is a schematic cross-sectional view showing a variable resistor in accordance with certain embodiments of the present invention.

FIG. 5 is a schematic cross-sectional view showing a variable resistor in accordance with certain embodiments of the present invention. As seen in FIG. 5, a first electrode 119, a phase-changeable material pattern 121, and a second electrode 123 are provided. A lower intermetal dielectric layer 115 and an upper intermetal dielectric layer 125 and an upper interconnection 129 are also provided. A conductive plug 127 electrically connects the upper interconnection 129 and the second electrode 123.

The first electrode 119 is contact-plug-shaped and penetrates a specific region of the lower intermetal dielectric layer 115. The phase-changeable material pattern 121 is disposed on the lower intermetal dielectric layer 115 and the first electrode 119 so as to be connected to the first electrode 119. The second electrode 123 is disposed on a surface of the phase-changeable material pattern 121. The conductive plug 128 penetrates a specific region of the upper interconnection dielectric layer 125 so as to be connected to a portion of the second electrode 123. The upper interconnection 129 is disposed on the upper dielectric layer 125 so as to be connected to the conductive plug 128.

As described above, the phase-changeable material pattern 121 has a high resistivity because of its polycrystalline state has a plurality of small grains. The phase-changeable material pattern 121 may be a chalcogenide compound containing nitrogen. For example, the phase-changeable material pattern 121 may be anyone of Ge—Sb—Te—N, As—Sb—Te—N, As—Ge—Sb—Te—N, Sn—Sb—Te—N, In—Sn—Sb—Te—N, a 5A group element-Sb—Te—N, a 6A group element-Sb—Te—N, a 5A group-Sb—Se—N, and/or a 6A group-Sb—Se—N. An amount of the nitrogen atoms may be from about 0.25% to about 25% with respect to the total atomic weight of the phase-changeable material pattern. Resistivity of the phase-changeable material layer according to concentrations of the nitrogen atoms is illustrated in FIG. 2. As seen in FIG. 2, the resistivity increases as the concentration of the nitrogen atoms increases.

An interface region between the first electrode 119 and the phase-changeable material pattern 121 depends on a diameter of the first electrode 119 and the crystalline state of the phase-changeable material changes at the interface region thereof. Furthermore, the second electrode 123 contacts with the surface and, in some embodiments, the entire surface, of the phase-changeable material pattern 121. Therefore, when current flows between the two electrodes 119 and 123 via the phase-changeable material pattern 121, current density thereof increases because the interface region between the first electrode 119 and the phase-changeable material pattern 121 is narrow. Therefore, the crystalline state thereof varies. In the drawings, the first electrode is contact-plug-shaped but the second electrode or both may be contact-plug-shaped. The first electrode 119, the phase-changeable material pattern 121 and the second electrode 123 may provide a variable resistor 124, that is, a phase-changeable memory cell.

The first electrode 119 and/or the second electrode 123 may be a conductive material containing nitrogen, a conductive material containing carbon, titanium, tungsten, molybdenum, tantalum, titanium silicide, tantalum silicide and/or a combination thereof. The conductive material containing nitrogen may be titanium nitride (TiN), tantalum nitride (TaN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (MoAlN), tantalum silicon nitride (TaSiN), tantalum aluminum nitride (TaAlN), titan oxide nitride (TiON), titan aluminum oxide nitride (TiAlON), tungsten oxide nitride (WON) and/or tantalum oxide nitride (TaON). The conductive material containing carbon may include graphite, for instance.

The conductive plug 127 electrically connecting the upper interconnection 129 and the second electrode 123 and may be formed of aluminum (Al), aluminum-copper alloy (Al—Cu), aluminum-copper-silicon alloy (Al—Cu—Si), tungsten silicide (WSi), copper (Cu), tungsten titanium (TiW), tantalum (Ta), molybdenum (Mo), tungsten (W), etc. The upper interconnection 129 may serve as a data line (a bit line) transferring logic information stored in the variable resistor 124. The upper interconnection 129 may be formed of aluminum (Al), aluminum-copper alloy (Al—Cu), aluminum-copper-silicon alloy (Al—Cu—Si), tungsten silicide (WSi), copper (Cu), tungsten titanium (TiW), tantalum (Ta), molybdenum (Mo), tungsten (W), etc.

In FIG. 5, the second electrode 123 serves as a barrier layer preventing a reaction between the conductive plug 127 and the phase-changeable material pattern 121.

Figure 6:
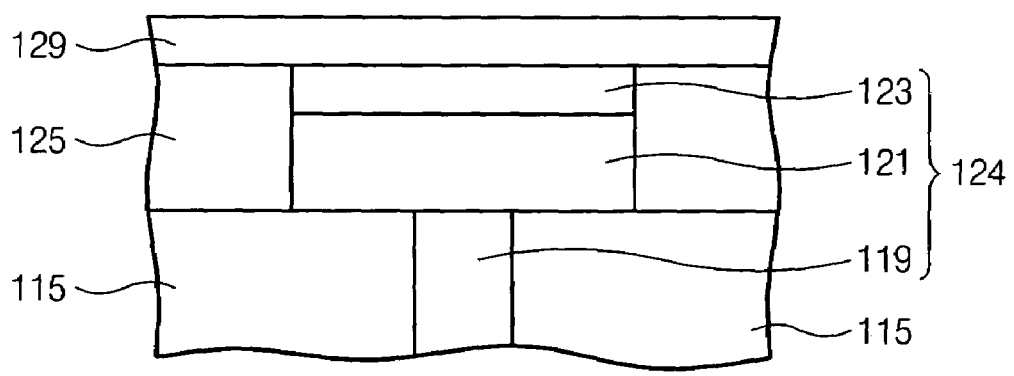
FIG. 6 is a schematic cross-sectional view showing a variable resistor in accordance with additional embodiments of the present invention.

FIG. 6 is a schematic cross-sectional view showing certain embodiments of a variable resistor structure including the above nitrogen containing phase-changeable material layer. The variable resistor of FIG. 6 has substantially the same structure as that of FIG. 5, however, the upper interconnections and electrical connections differ. As seen in FIG. 6, the upper interconnection 129 directly contacts the second electrode 123 without a conductive plug.

Figure 7:
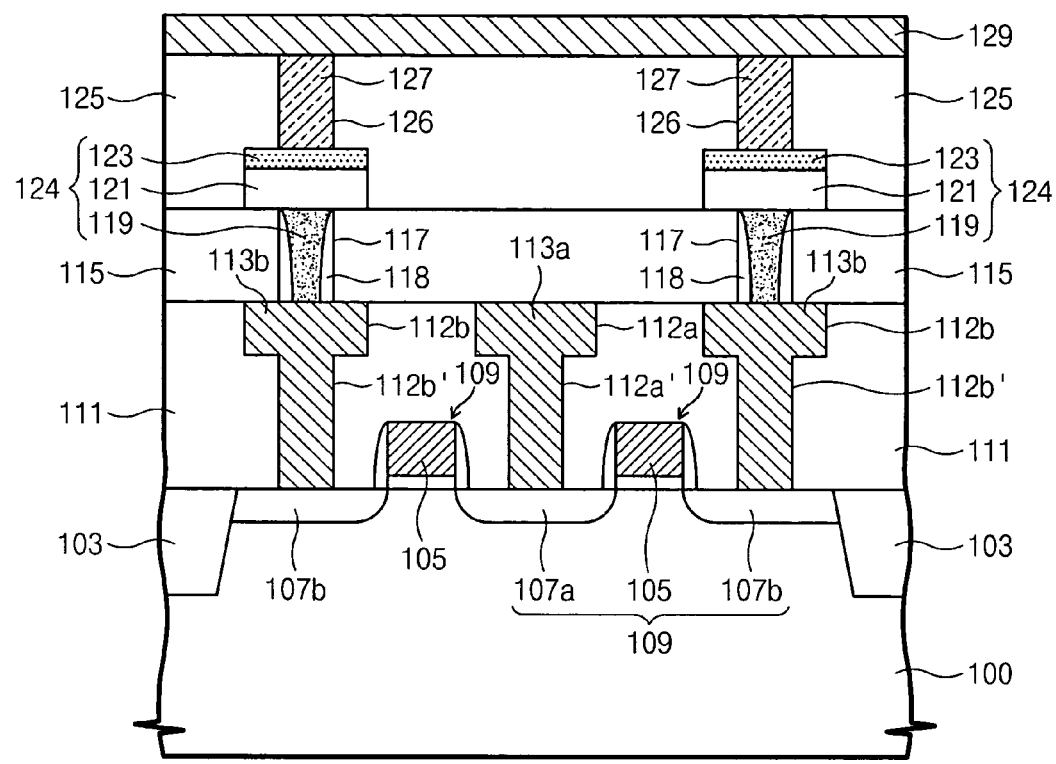
FIG. 7 is a schematic cross-sectional view showing a phase-changeable memory device employing the variable resistor of FIG. 5.

FIG. 7 is a schematic cross-sectional view illustrating a phase-changeable memory device employing the variable resistor of FIG. 5. As seen in FIG. 7, the phase-changeable memory device includes a semiconductor substrate 100, a field isolation region 103, an interlayer dielectric layer 111, a transistor 109, a lower interconnection 113a, a contact pad 113b, a contact hole 117, an insulating spacer 118, a drain region 107a, a gate electrode 105 and a source region 107b.

The field isolation region 103 is formed in the semiconductor substrate 100 to define a predetermined shaped active region. The device isolation region 103 may, for example, be formed by a local oxidation of silicon or trench isolation technologies. The transistor 109 runs the active region and a field isolation region 103 of the semiconductor substrate 100. The transistor 109 includes a gate electrode 105 and source/drain regions 107b and 107a that are formed at both sides of the gate electrode 105. An active region between the source/drain regions 107b and 107a under the gate electrode 105 corresponds to a channel of the transistor 109. The transistor 109 may serve as a word line.

The interlayer dielectric layer 111 is provided on the semiconductor substrate 100 to cover the transistor 109. A contact pad 113b and a lower interconnection 113a are placed in the interlayer dielectric layer 111, which electrically connect to the source and drain regions 107b and 107a, respectively. The lower interconnection 113a runs parallel to the transistor 109.

A lower intermetal dielectric layer 115 of FIG. 5 is disposed on the contact pad 113b, the lower interconnection 113a and the interlayer dielectric layer 111. The first electrode 119 is electrically connected to the contact pad 113b. The phase-changeable material pattern 121, a second electrode 123, a conductive plug 127 and an upper interconnection 129 are disposed as described above with reference to FIG. 5.

To reduce an interface region between the first electrode 119 and the phase-changeable material pattern 121, the insulating spacer 118 may be interposed between the contact hole 117 and the first electrode 119, that is, a diameter of the contact hole 117 depends on a resolution of the photolithographic process. Therefore, the insulating spacer 118 is disposed to reduce the diameter and the first electrode 119 fills the reduced diameter contact hole. Thus, an interface area between the first electrode 119 and the phase-changeable material pattern 121 may be formed smaller than the resolution of the photolithographic process. As a result, current needed to perform a write operation may be further reduced.

Operations of the phase-changeable memory device illustrated in FIG. 7 are explained below with reference to FIG. 8, which is an equivalent circuit view of the device illustrated in FIG. 7.

Figure 8:
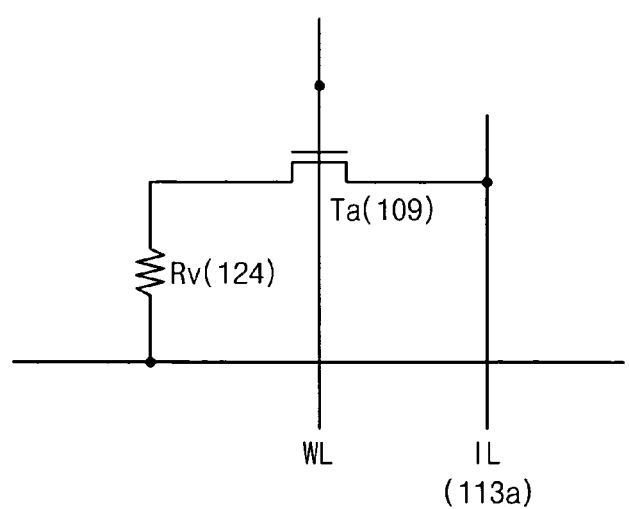
FIG. 8 is an equivalent circuit diagram corresponding to FIG. 7.

As seen in FIG. 8, the phase-changeable memory device includes an access transistor Ta 109 and a variable resistor Rv 124. The variable resistor Rv 124 includes a phase-changeable material pattern 121 interposed between the two electrodes 119 and 123. An upper interconnection 129 is connected to a second electrode 123 of the variable resistor Rv 124 and serves as a bit line BL. The access transistor Ta 109 includes a drain region, a source region and a gate electrode. The drain region is electrically connected to the lower interconnection IL 113a, the source region is electrically connected to the first electrode of the variable resistor Rv 124, and the gate electrode is a word line WL.

In a write operation for writing logic information (e.g., "0" (a high resistance state) or "1" (a low resistance state)) to the variable resistor Rv 124, a signal sufficient to turn on the access transistor Ta is applied to the word line WL and a bit line BL is grounded. Then, a signal is input to the lower interconnection IL. The signal input to the lower interconnection IL corresponds to a current pulse having a magnitude and duration corresponding to the logic information to be written. Therefore, current flows between the lower interconnection IL and the bit line BL through the variable resistor Rv. The phase-changeable material pattern of the variable resistor Rv changes the crystalline state thereof based on the current pulse, thereby changing a resistance of the variable resistor Rv.

According to certain embodiments of the present invention, because the resistivity of the phase-changeable material pattern of the variable resistor Rv is greater than that of a conventional phase-changeable material pattern, the amplitude of the current pulse (i.e., a signal applied to the lower interconnection) that provides the desired heating may be less than the amplitude of a current pulse that would produce the desired heating if a conventional phase-changeable material pattern were used.

With regard to a read operation for reading logic information of the variable resistor Rv, a signal sufficient to turn on the access transistor Ta is applied to a word line WL, the lower interconnection IL is grounded, and an operation voltage is applied to a bit line BL. In this case, the operation voltage is not sufficient to change the crystalline state of the phase-changeable material pattern. Therefore, current flows between the bit line BL and the lower interconnection IL via the variable resistor Rv and a resistivity of the phase-changeable material pattern (i.e., logic information) is sensed through the bit line BL.

FIGS. 9A through 9H are cross-sectional views illustrating methods of forming the phase-changeable memory device of FIG. 7.

Figure 9A:
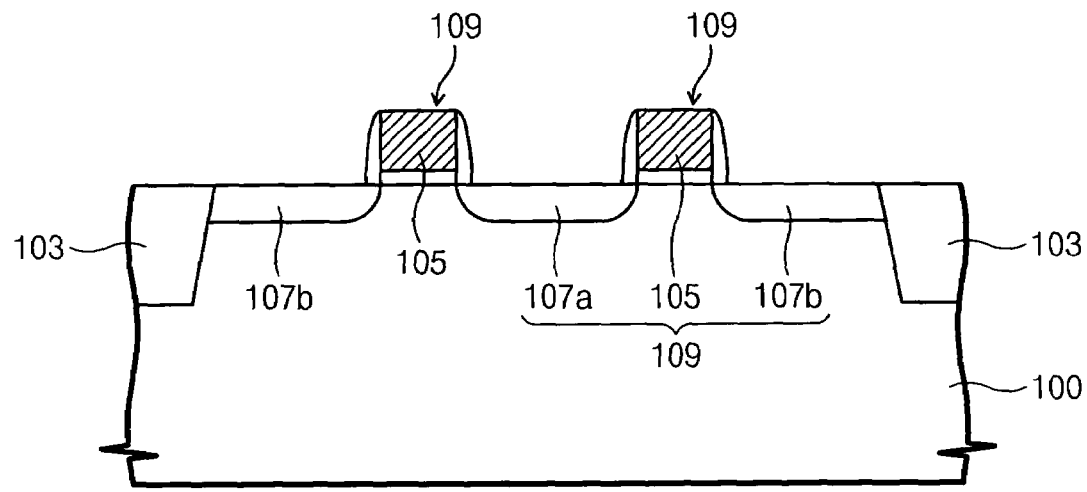
FIGS. 9A through 9H are cross-sectional views illustrating methods of forming the phase-changeable memory device of FIG. 7.

Referring to FIG. 9A, a conventional MOS field effect transistor (MOSFET) is fabricated by forming a field isolation region 103 and a transistor 109 in a semiconductor substrate 100. The field isolation region 103 is an insulation region to define an active region, and may be formed by local oxidation of silicon (LOCOS) or a shallow trench isolation technique. The transistor 109 is formed on the semiconductor substrate 100 and includes a gate electrode 105, a source region 107b and a drain region 107a. The gate electrode 105 extends along one direction and the source and drain regions 107b and 107a are formed at both sides of the gate electrode 105. An active region under the gate electrode 105 serves as a current path (channel) between the source and drain region 107b and 107a. A gate-insulating layer is provided between the gate electrode 105 and the channel region.

Figure 9B:
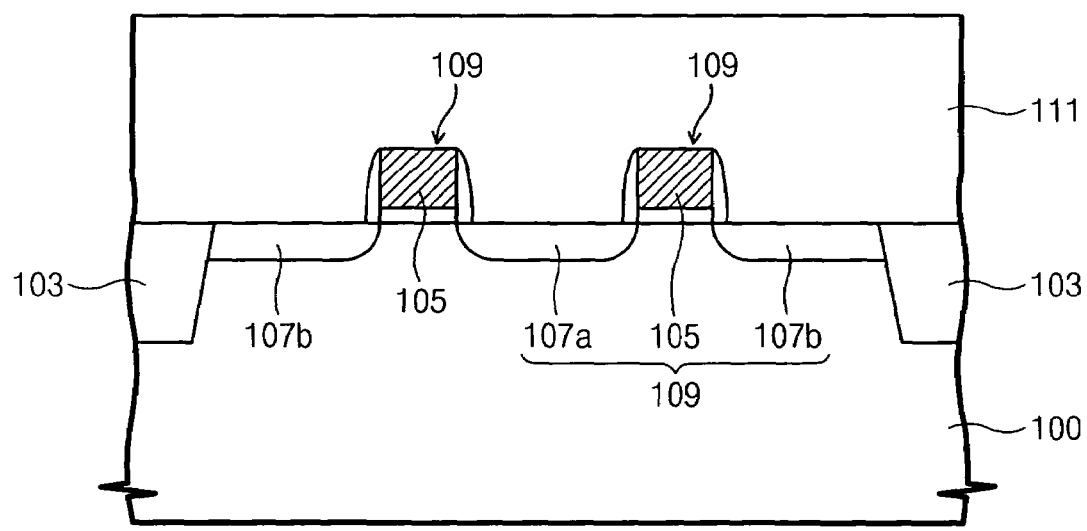

Referring to FIG. 9B, an interlayer dielectric layer 11 is formed to cover the transistor 109. The interlayer dielectric layer 111 may be formed of silicon oxide and may be formed by a chemical vapor deposition (CVD).

Figure 9C:
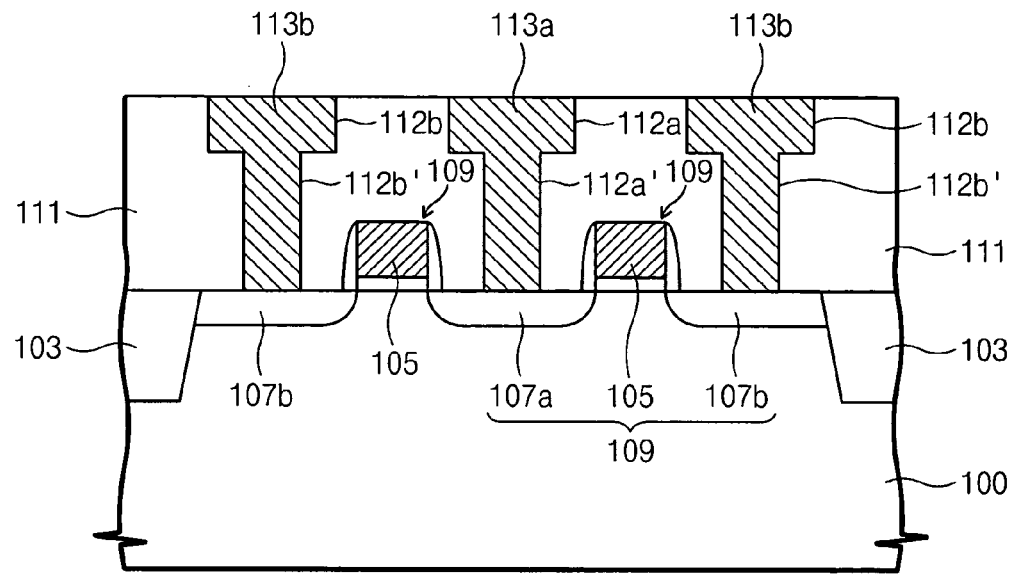

FIG. 9C illustrates a process for forming a lower interconnection 113a. The lower interconnection 113a is a conductive interconnection electrically connected to the drain region 107a of the transistor 109. For example, the lower interconnection 113a may extend parallel to the gate electrode 105. In the embodiments illustrated in FIG. 9C, the lower interconnection 113a is formed by a dual damascene process. In particular, the interlayer dielectric layer 111 is patterned to form an interconnection groove 112a and contact hole 112a' exposing the drain region 107a at a specific region of the interconnection groove 112a.

The groove 112a and the contact hole 112a' are substantially filled with conductive materials to form the lower interconnection 113a electrically connected to the drain region 107a. In this case, contact pads 113b electrically connected to the source regions 107b are also formed during the formation of the lower interconnection 113a. That is, while forming the interconnection groove 112a and the contact hole 112a', openings for contact pads 112b and contact holes 112b' exposing the source region 107b are formed. The contact holes 112b' are connected to the openings 112b. While the groove 112a and the contact hole 112a' are filled with conductive material, the openings 112b and the contact holes 112b' are also substantially filled with the conductive material. The contact pad 113b electrically connects the variable resistor 124 of FIG. 9F to the source region 107b.

In the embodiments illustrated in FIG. 9C, the lower interconnection 113a and the contact pad 113b are formed using a dual damascene process but other methods could also be used. That is, the lower interlayer dielectric layer 111 is patterned to form contact holes exposing the source and drain regions 107b and 107a. Then, a conductive material layer is formed on the interlayer dielectric layer 111 to fill the contact holes. Finally, the patterning process may be performed on the conductive material layer to form the lower interconnection and the contact pad.

Figure 9D:
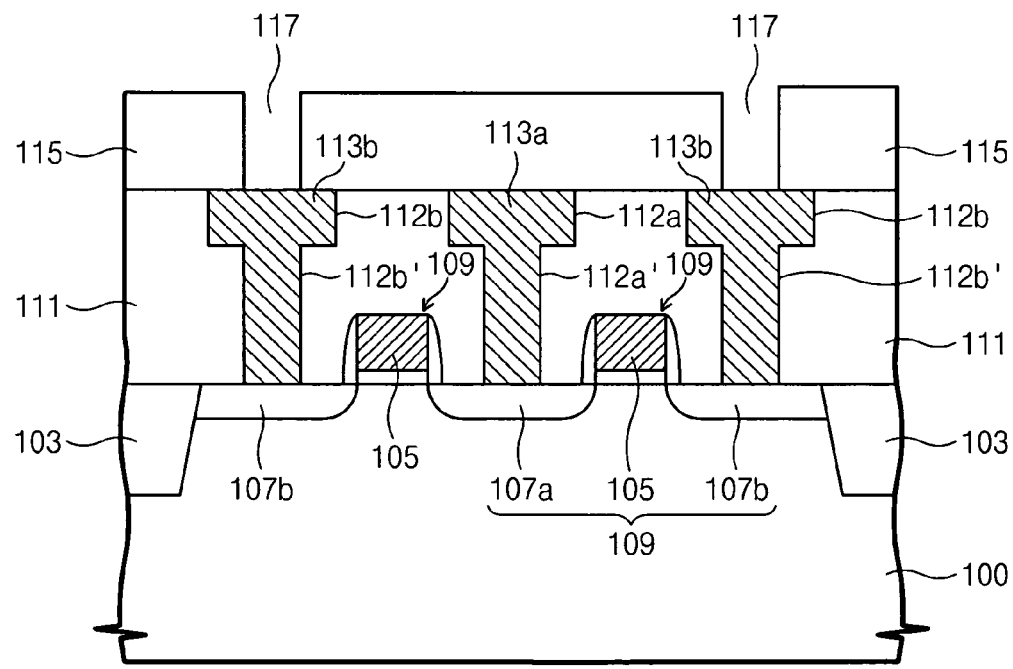

Referring to FIG. 9D, a lower intermetal dielectric layer 115 is formed on the lower interconnection 113a, the contact pad 113b and the interlayer dielectric layer 111. The intermetal dielectric layer 115 may be formed of silicon oxide by chemical vapor deposition, for example. The lower intermetal dielectric layer 115 is patterned to form contact holes 117 exposing the contact pad 113b.

Figure 9E:
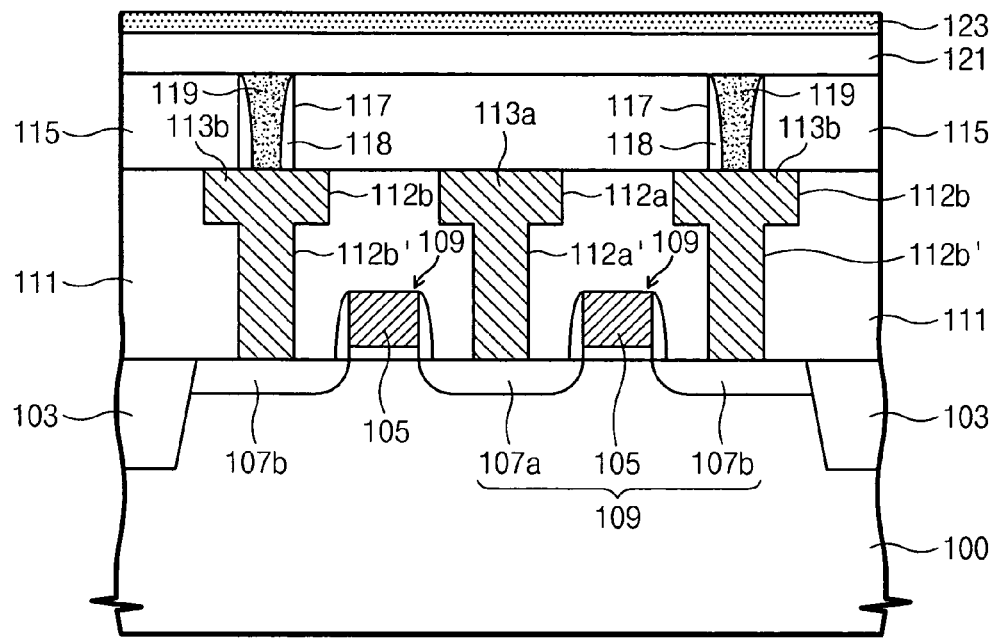

Referring to FIG. 9E, insulating spacers 118 are formed on sidewalls of the contact holes 117 exposing the contact pad 113b, thereby reducing a diameter of the contact hole 117. Therefore, an interface area between the first electrode and the phase-changeable material pattern may be reduced beyond the limitation of photolithographic process. The insulating spacers 118 are formed by an etch back process that etches an insulating layer without using an etch mask after the insulating layer is deposited.

Referring to FIG. 9E again, the insulating spacers 118 are formed, and then a first electrode 119 is formed by substantially filling the reduced diameter contact hole such that the first electrode 119 is electrically connected to the contact pad 113b. The first electrode 119 may be formed by depositing a conductive material and planarizing. Planarizing the conductive layer may be carried out, for example, by CMP or an etch back process.

The first electrode 119 may be a conductive material containing nitrogen, a conductive material containing carbon, titanium, tungsten, molybdenum, tantalum, titanium silicide, tantalum silicide, and/or a combination thereof. The first electrode 119 may be formed by a chemical vapor deposition, a physical vapor deposition, an atomic layer vapor disposition, etc. The conductive material containing nitrogen may be titanium nitride (TiN), tantalum nitride (TaN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), silicon aluminum nitride (ZrAlN), molybdenum silicon nitride (MoSiN), molybdenum aluminum nitride (MoAlN), tantalum silicon nitride (TaSiN), tantalum aluminum nitride (TaAlN), titanium oxide nitride (TiON), titanium aluminum oxide nitride (TiAlON), tungsten oxide nitride (WON) and/or tantalum oxide nitride (TaON).

Particular embodiments of the present invention will now be described where the first electrode 119 is formed of titanium aluminum nitride by the atomic vapor deposition. Carbon tetrachloride ($TiCl_4$) gas flows into a reactor as a source gas and is adsorbed chemically on a semiconductor substrate with the insulating spacers 118. The non-adsorbed carbon tetrachloride is purged (exhausted out from the reactor) by a purging gas, and then ammonia ($NH_3$) flows into the reactor as a nitrogen source. As a result, a titanium nitride layer (TiN) is formed. Next, aluminum trimethane ($Al(CH_3)_3$) gas flows into the reactor as an aluminum source and is adsorbed on the titanium layer. The non-adsorbed trimethane gas is exhausted out from the reactor by a purging gas. Again, the ammonia gas flows into the reactor and then is purged. This cycle is repeated to form a desired thickness titanium aluminum nitride layer (TiAlN). To support inflow of those source gases, a carrier gas (e.g., argon or nitrogen gas) can be used.

Referring again to FIG. 9E, a phase-changeable material layer 121 and a second electrode layer 123 are formed on the lower intermetal interconnection 115 after the first electrode 119 is formed. The phase-changeable material layer 121 contains nitrogen atoms. For example, the phase-changeable material layer 121 may be formed by a sputtering method using nitrogen gas and argon gas as a carrier gas, targeting chalcogenide compounds. In this case, the phase-changeable material layer 121 may be formed at about 100–350° C., for instance. According to certain embodiments of the present invention, the phase-changeable material layer 121 has a polycrystalline state that includes a plurality of small grains of about 100 nm or lesser. In particular embodiments, the phase-changeable material layer 121 has a grain size of about 40 nm or lesser. The phase-changeable material layer 121 includes about 0.25 to about 15 atomic percent nitrogen atoms. The chalcogenide compounds may be formed of, for example, Ge—Sb—Te, As—Sb—Te, As—Ge—Sb—Te, Sn—Sb—Te, In—Sn—Sb—Te, Ag—In—Sb—Te, a 5A group element-Sb—Te, a 6A group element-Sb—Te, a 5A group element-Sb—Se, a 6A group-Sb—Se, etc. Therefore, the phase-changeable material layer 121 may be formed of Ge—Sb—Te—N, As—Sb—Te—N, As—Ge—Sb—Te—N, Sn—Sb—Te—N, In—Sn—Sb—Te—N, Ag—In—Sb—Te—N, a 5A group element-Sb—Te—N, a 6A group element-Sb—Te—N, a 5A group element-Sb—Se—N, a 6A group element-Sb—Se—N, etc.

Exemplary embodiments of forming the Ge—Sb—Te—N using a sputtering will be explained hereinafter. The Ge—Sb—Te—N is formed to a thickness of from about 100 to about 1000 Å, targeting Ge—Sb—Te, under the condition of 10 mm Torr argon, about 1 mm Torr nitrogen, about 500 W DC power and about 100–350° C. The phase-changeable material layer has a polycrystalline state that includes a plurality of small grains (40 nm or lesser) as shown in FIG. 4.

The second electrode layer 123 may be formed by chemical vapor deposition, physical vapor deposition, atomic layer deposition, etc. and using the same material as the first electrode 119. For example, the second electrode 123 may be conductive materials containing nitrogen, conductive materials containing carbon, titanium, tungsten, molybdenum, tantalum, titanium silicide, tantalum silicide, and/or a combination thereof.

Exemplary embodiments of forming the second electrode with titanium aluminum nitride using a physical vapor deposition will be explained hereinafter. In particular, the method using atomic vapor deposition may be the same as what is explained above. The second electrode layer 123 may be formed about 100–1000 Å in a DC sputter targeting a titanium aluminum alloy (20 atomic percent aluminum), under the condition of about 3 mm Torr argon, about 3 mm Torr nitrogen and about 1500 W DC power.

Figure 9F:
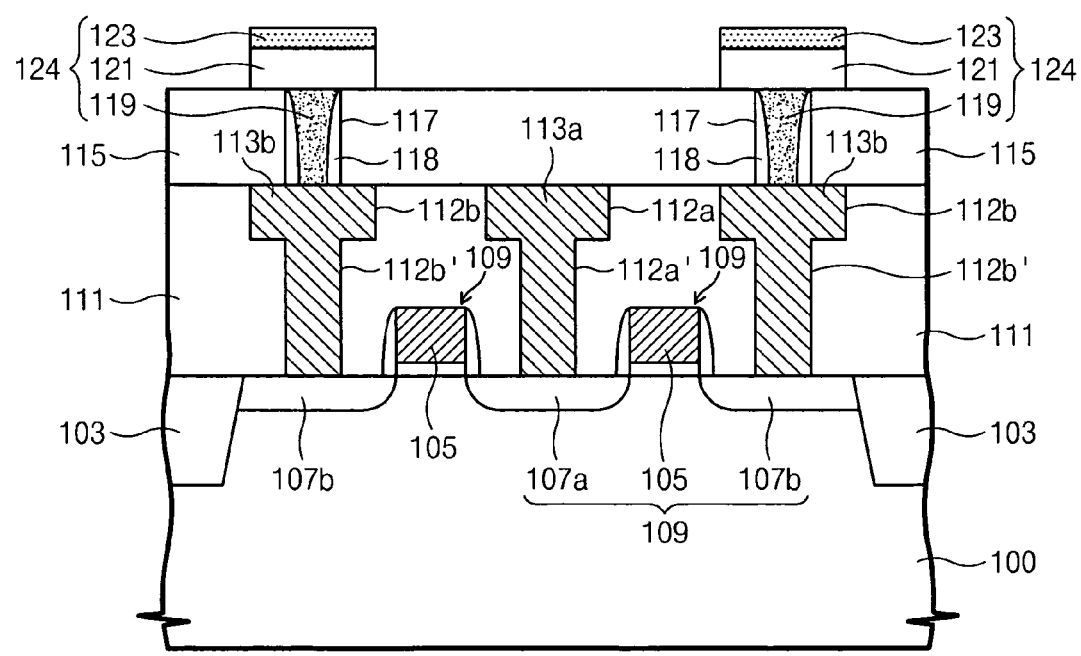

Referring to FIG. 9F, the second electrode layer 123 and the phase-changeable material layer 121 are patterned to contact with the first electrode 119, thereby forming a variable resistor 124 electrically isolated from the neighboring devices.

Figure 9G:
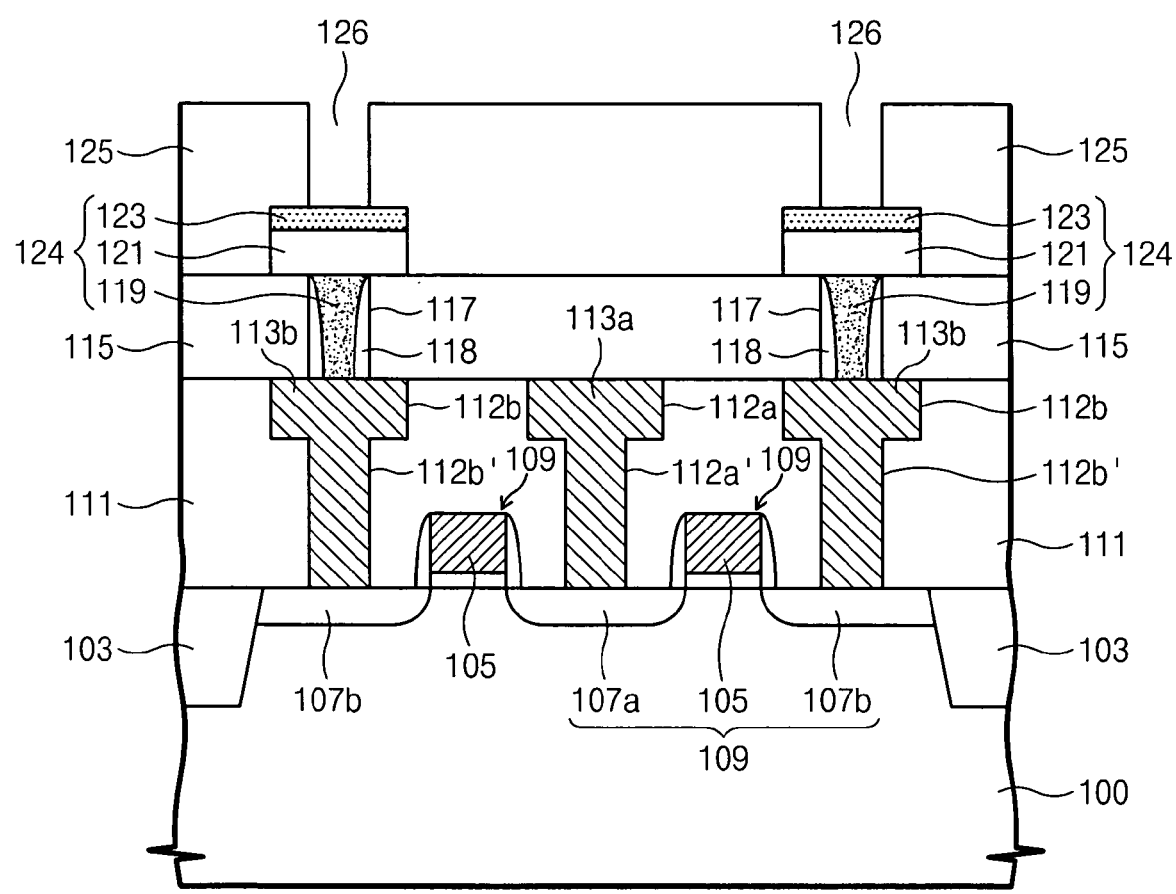

The subsequent process is for forming an upper interconnection. Referring to FIG. 9G, an upper intermetal dielectric layer 125 is formed to cover the variable resistor 124 on the lower intermetal dielectric layer 115. The upper intermetal dielectric layer 125 may be a silicon oxide layer formed by chemical vapor disposition. The upper intermetal dielectric layer 125 is patterned to form a contact hole 126 exposing the second electrode 123 of the phase-changeable resistor 124.

Figure 9H:
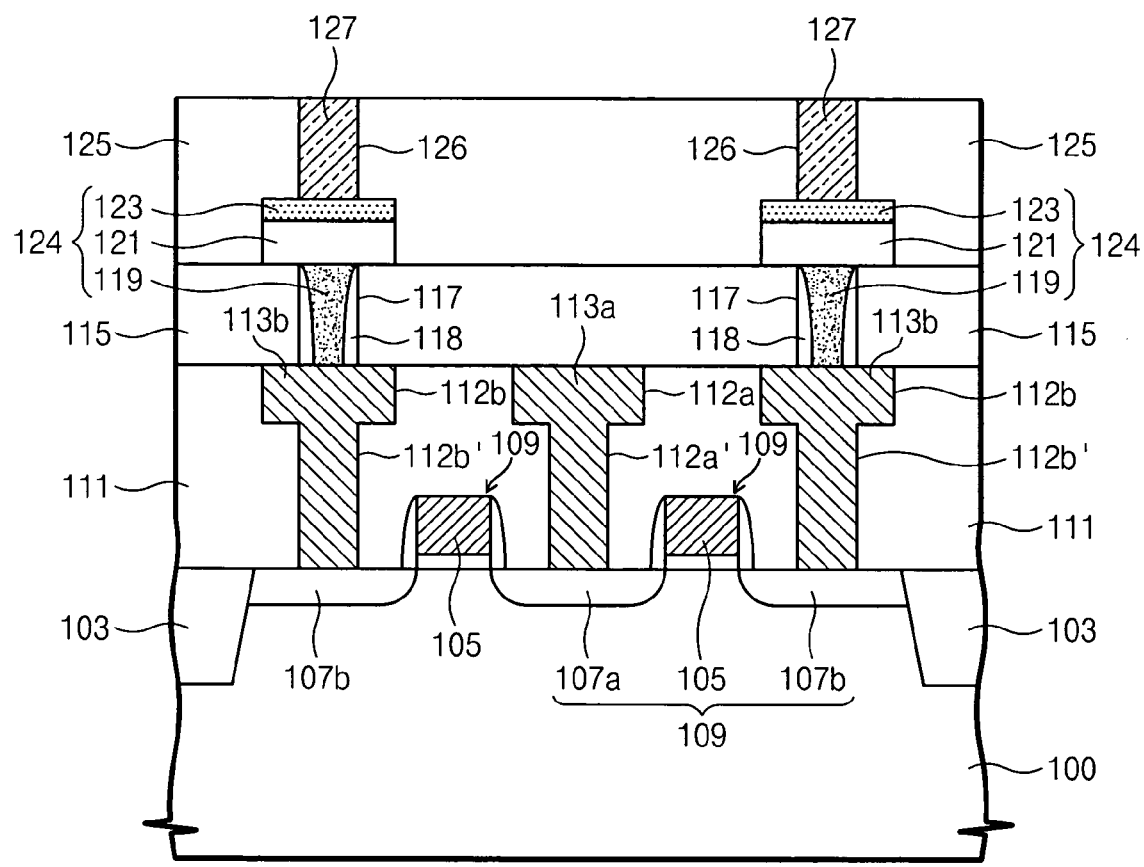

Referring to FIG. 9H, a conductive plug 127 is formed by filling conductive materials in the contact hole 126 exposing the second electrode 123. An upper interconnection material is formed on the upper intermetal dielectric layer 125 with the conductive plug 127 and then patterned to form an upper interconnection 129 electrically connected to the conductive plug 127 as illustrated in FIG. 7. As a result, the conductive plug 127 connects the second electrode 123 and the upper interconnection 129 electrically. The conductive plug 127 may be formed by depositing conductive material to substantially fill the contact hole 126 exposing the second electrode 123 and planarizing the deposited conductive material.

The conductive plug 127 may be formed of aluminum, aluminum copper alloy, aluminum copper silicon alloy, tungsten silicide, titanium, tungsten, molybdenum, tantalum, titanium tungsten, copper, etc. by physical vapor deposition, chemical vapor deposition, etc. The upper interconnection 129 may also be formed of the same material as the conductive plug 127.

Alternatively, the conductive plug and the upper interconnection may be formed in a single process, that is, the contact hole 126 exposing the second electrode 123 is formed and then a conductive material layer is formed on the contact hole 126 and the upper intermetal dielectric layer 125. The conductive material layer is then patterned, thereby forming an upper interconnection electrically connected to the second electrode 123.

Figure 10A:
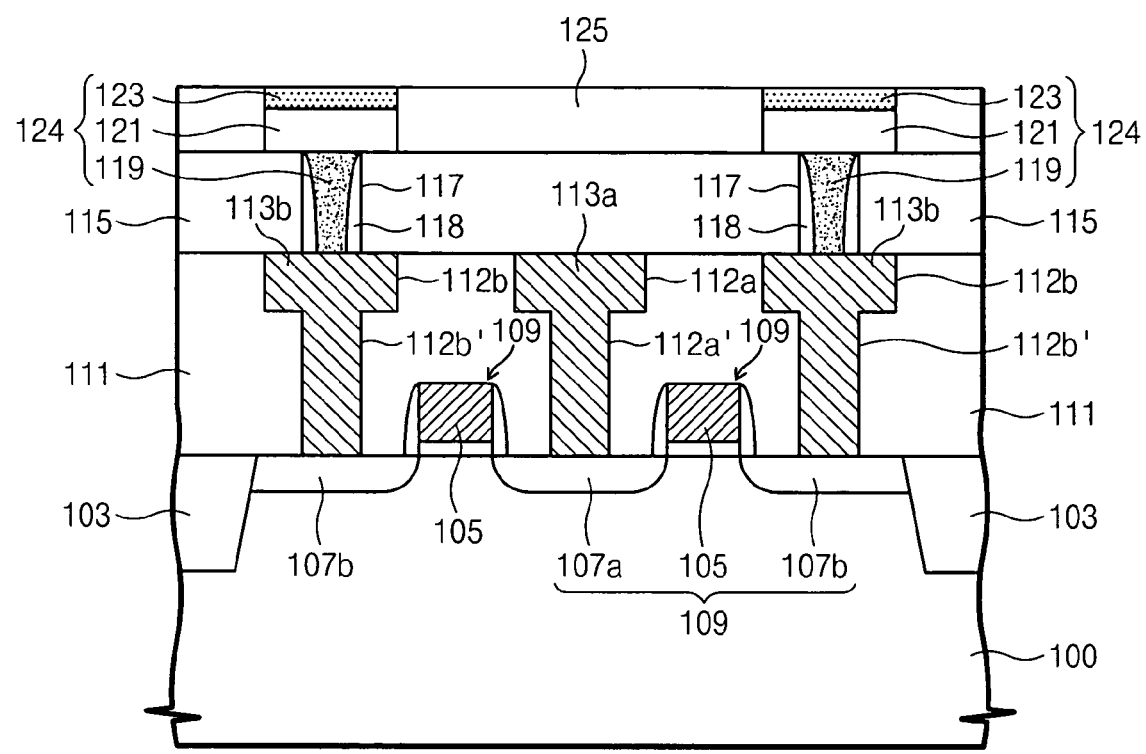
FIG. 10A through 10B are cross-sectional views illustrating methods of forming phase-changeable memory devices incorporating the variable resistor of FIG. 5.
Figure 10B:
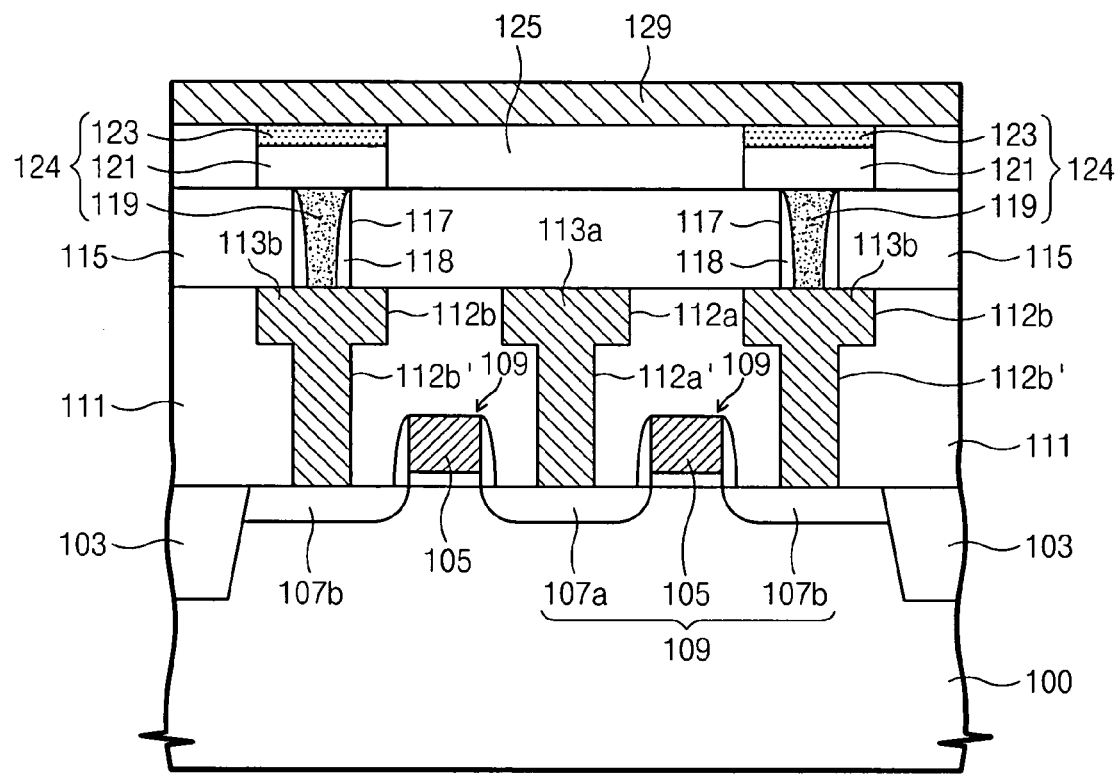

FIGS. 10A and 10B are cross-sectional views illustrating an electric connection method between the upper interconnection and the second electrode. In the embodiments of the present invention illustrated in FIGS. 10A and 10B, the contact-hole process for exposing the second electrode is omitted and the second electrode directly connects the upper interconnection.

Referring to FIG. 10A, a variable resistor 124 is formed as shown in FIG. 9F and then an upper intermetal dielectric layer 125 is formed. A planarization process is applied to the upper intermetal dielectric layer 125. The intermetal dielectric layer 125 is planarized to substantially the same height as the second electrode 123 as illustrated in FIG. 10A. The planarization process may be performed using a chemical mechanical polishing (CMP) or an etch back process.

Referring to FIG. 10b, a conductive material layer is formed on the upper intermetal dielectric layer 125 and the second electrode 123 and then patterned to form an upper interconnection 129. The upper interconnection 129 may be formed of aluminum, aluminum-copper alloy, aluminum-copper-silicon alloy, tungsten silicide, titanium, tungsten, molybdenum, tantalum, titanium tungsten, copper, etc. by physical vapor deposition, chemical vapor deposition, etc. The upper interconnection 129 directly contacts with the second electrode 123.

Figure 11:
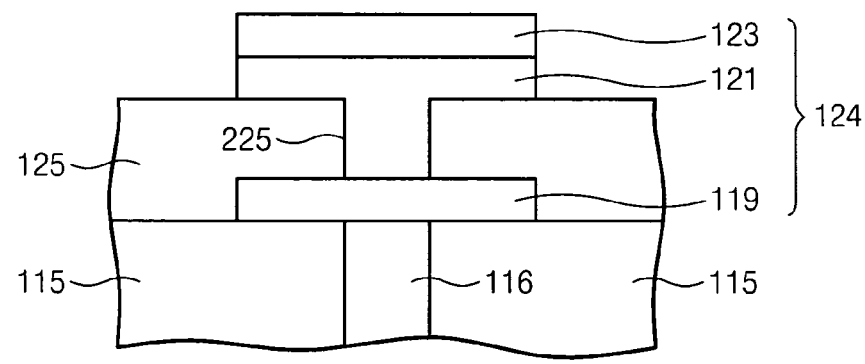
FIG. 11 is a schematic cross-sectional view illustrating a variable resistor according to further embodiments of the present invention.

FIG. 11 is a schematic cross-sectional view showing a variable resistor according to further embodiments of the present invention. The structure of FIG. 11 differs from the structure shown in FIGS. 5 and 6 in that the phase-changeable material pattern 121 is connected to the first electrode 119 through a contact hole 225 formed in a specific region of the dielectric layer 125. In addition, the first electrode 119 formed on the dielectric layer 115 does not have a contact-plug-shape but has a substantially uniform shape.

Specifically, a first electrode 119 is provided on the lower intermetal dielectric layer 115. The first electrode 119 is electrically connected to a semiconductor substrate through a contact plug 116 penetrating the lower intermetal dielectric layer 115. An upper intermetal dielectric layer 125 is disposed on the lower intermetal dielectric layer 115 to cover the first electrode 119. The upper intermetal dielectric layer 125 includes a contact hole 225 exposing a portion of the first electrode 119. A phase-changeable material pattern 121 is placed on the upper intermetal dielectric layer 125. The phase-changeable pattern 121 is electrically connected to the first electrode 119 through the contact hole 225. A second electrode 123 is disposed on the phase-changeable material pattern 121. The first electrode 119, the phase-changeable material pattern 121 and the second electrode 123 provide a variable resistance 124.

The phase-changeable material pattern 121 has a polycrystalline state with a plurality of small grains, such that resistivity thereof is high. In certain embodiments of the present invention, the phase-changeable material pattern 121 is a chalcogenide compound doped with nitrogen atoms. For example, the phase-changeable material pattern 121 may be Ge—Sb—Te—N, As—Sb—Te—N, As—Ge—Sb—Te—N, Sn—Sb—Te—N, In—Sn—Sb—Te—N, a 5A group element-Sb—Te—N, a 6A group element-Sb—Te—N, a 5A group element-Sb—Se—N and/or a 6A group element-Sb—Se—N. An amount of the nitrogen atoms may be from about 0.25 to about 25% with respect to atomic weights of the total ingredients included in the phase-changeable material pattern.

The second electrode 123 is electrically connected to the upper interconnection in the same way as what is illustrated in FIGS. 5 and 6. That is, the second electrode 123 may either directly or through a plug, contact the upper interconnection. In addition, the first electrode 119 is electrically connected to a source region of the access transistor formed in the substrate through a contact plug 116.

Particular methods of forming a phase-changeable memory device including the resistor of FIG. 11 will be briefly explained. A field isolation region, a transistor, a lower interconnection, a contact pad, etc. are formed on the semiconductor substrate in the same manner as explained referring to FIGS. 9A through 9C. Then, a lower intermetal dielectric layer 115 is formed. The lower intermetal dielectric layer 115 is patterned to form a contact hole exposing the metal pad. The contact hole is filled with conductive material to form a contact plug 116.

A first electrode material layer is deposited on the contact plug 116 and the lower intermetal dielectric layer 115 and then patterned to form a first electrode layer 119. The first electrode 119 covers the contact plug 116. An upper intermetal dielectric layer 125 is formed on the surface of the semiconductor substrate. The upper intermetal dielectric layer 125 is patterned to form a contact hole 225 exposing the first electrode 119. A phase-changeable material layer is formed in the contact hole 225 and on the upper intermetal dielectric layer 125. The phase-changeable material layer 121 contains nitrogen atoms. For example, the phase-changeable material layer 121 may be formed by a sputtering method targeting chalcogenide compounds, using argon gas as a carrier gas and nitrogen gas. The phase-changeable material layer 121 may be formed in a temperature range of from about 100° C. to about 350° C.

After a second electrode material is formed on the phase-changeable layer, the second electrode material and the phase-changeable material layer are successively patterned to form a phase-changeable pattern 121 and the second electrode 123.

The subsequent processes are substantially the same as those described above and, therefore, need not be described further herein.

Figure 12:
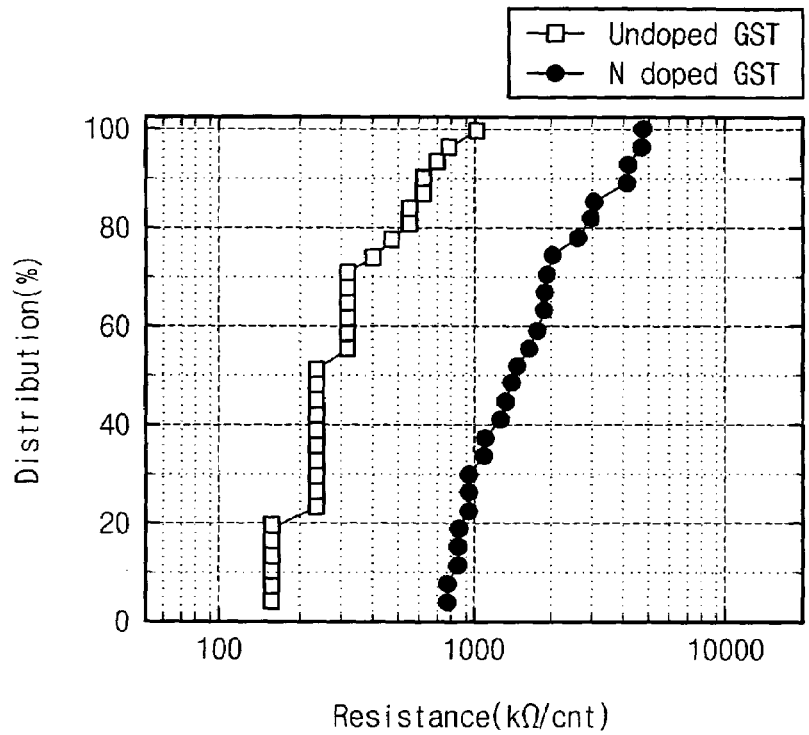
FIG. 12 is a graph showing cumulative distributions of a phase-changeable memory device according to embodiments of the present invention and a conventional phase-changeable memory device.

FIG. 12 is a graph illustrating cumulative distributions of a phase-changeable memory device according to embodiments of the present invention and a conventional phase-changeable memory device. The horizontal axis refers to resistivity (kΩ/cnt) and the perpendicular axis refers to a cumulative distributions. In FIG. 12, -●- represents a phase-changeable memory device including a phase-changeable material layer doped with 7% atomic percent nitrogen atoms, and -□- indicates a conventional phase-changeable memory device. The graph shows the resistance of the phase-changeable memory device according to the present invention convention increases compared to the conventional device.

Figure 13:
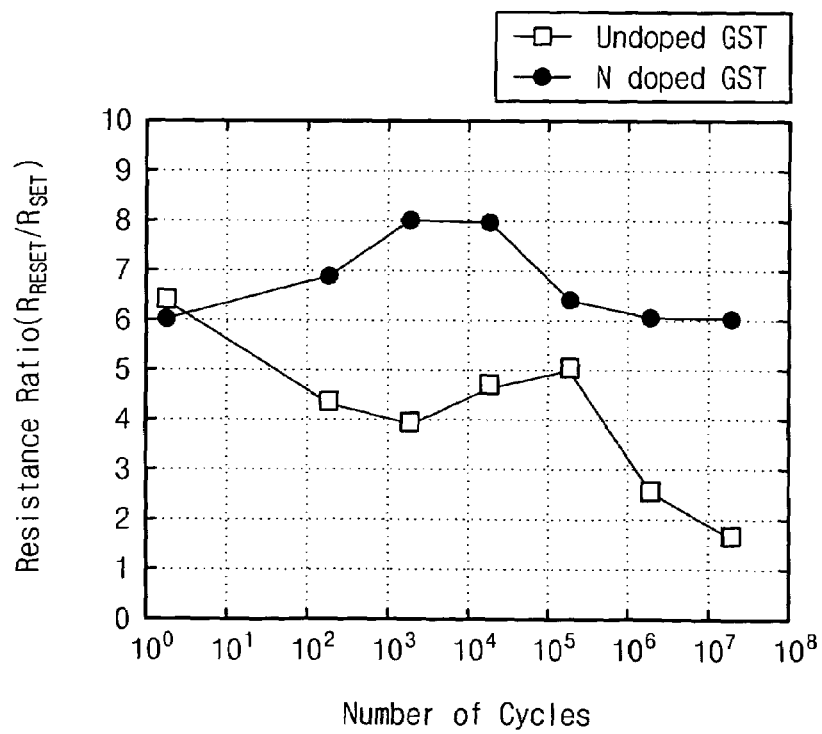
FIG. 13 is a graph showing reset/set resistances of a phase-changeable memory device having a phase-changeable material containing 7% nitrogen and a conventional phase-changeable memory device.

FIG. 13 is a graph showing reset/set resistances of a phase-changeable memory device having a phase-changeable material containing 7 atomic percent nitrogen atoms and a conventional phase-changeable memory device. In FIG. 13, the horizontal axis refers to numbers of writing operations and the perpendicular axis refers to reset/set resistances. In FIG. 13, -●- represents the resistance of a phase-changeable material layer doped with 7 atomic percent nitrogen atoms, and -□- represents the resistance of a conventional phase-changeable material layer. For the conventional phase-changeable memory device, the reset/set resistance decreases as the writing operation cycle is repeated. However, in case of the phase-changeable memory device according to embodiments of the present invention, the reset/set resistance ratio is about 5 or more, which is similar to the initial value despite the repeated writing operations. That is, a phase-changeable memory device according to embodiments of the present invention may have good thermal stability.

Figure 14:
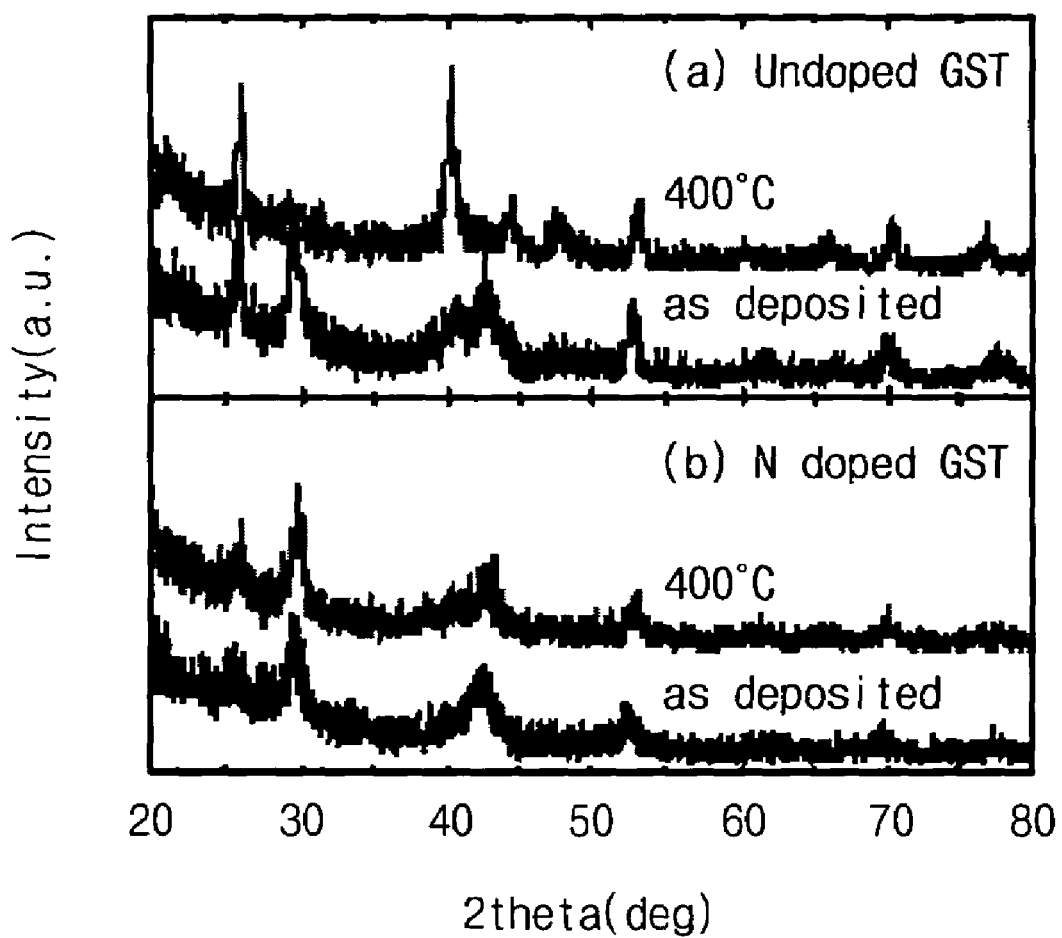
FIG. 14 is a graph showing XRD data of a phase-changeable material layer in a phase-changeable memory device according to embodiments of the present invention, containing 7% nitrogen and a conventional phase-changeable memory device.

FIG. 14 also illustrates the thermal stability of the phase-changeable memory devices according to embodiments of the present invention. FIG. 14 is a graph showing X-ray reflection data (XRD) of a phase-changeable material layer in a phase-changeable memory device according to embodiments of the present invention, containing 7% nitrogen atoms and a conventional phase-changeable memory device. The upper graph of FIG. 14 shows intensity of the conventional phase-changeable memory device and the lower graph is of the phase-changeable memory device according to embodiments of the present invention. In the case of the embodiments of the present invention, the intensity is substantially the same before and after the 400° C. annealing but in the case of the conventional phase-changeable memory device, the intensity changes before and after the annealing.

As described above, according to embodiments of the present invention, resistivity of the phase-changeable material layer can be increased over conventional phase-changeable material layers, such that the amplitude of the current pulse can be decreased during a writing operation. In addition, the resistivity of the phase-changeable material pattern can be controlled by adjusting the concentration of added nitrogen atoms.

A crystallization temperature of the phase-changeable material can also be raised to improve endurance. Finally, the phase-changeable material layer is provided with a polycrystalline state that includes small grains, such that diffusion distance increases over conventional phase-changeable materials. As a result, exterior contaminants can be reduced or even prevented from penetrating into the phase-changeable material layer.

While the present invention has been described by way of example and in terms of the particular embodiments, it is to be understood that the invention is not limited to the disclosed embodiments. To the contrary, it is intended to cover various modifications and similar arrangements would be apparent to those skilled in the art. Therefore, the scope of the appended claims, which define the invention, should be accorded the broadest interpretation so as to encompass all such modifications and similar structures.

What is claimed is:

1. A phase-changeable memory device, comprising:
   a phase-changeable material pattern of a phase-changeable material that includes nitrogen atoms; and
   first and second electrodes electrically connected to the phase-changeable material pattern and provide an electrical signal thereto;
   wherein an amount of the nitrogen atoms included in the phase-changeable material is from about 0.25% to about 25% with respect to the total atomic weight of ingredients of the phase-changeable material.

2. The device of claim 1, further comprising:
   a transistor including a source region, a drain region and a gate electrode;
   a lower interconnection electrically connected to the drain region; and
   an upper metal interconnection electrically connected to one of the first and second electrodes;
   wherein the other of the first and second electrodes is electrically connected to the source region.

3. The device of claim 1, wherein the first and second electrodes comprise a conductive material containing nitrogen, a conductive material containing carbon, titanium, tungsten, molybdenum, tantalum, titanium silicide, tantalum silicide and/or a combination thereof.

4. The device of claim 3, wherein the first and/or second conductive electrodes further include one of aluminum (Al), aluminum-copper alloy (Al—Cu), aluminum-copper-silicon alloy (Al—Cu—Si), tungsten silicide (WSi), copper (Cu), tungsten titanium (TiW) and/or a combination thereof.

5. The device of claim 3, wherein the conductive material containing nitrogen comprises titanium nitride (TiN), tantalum nitride (TaN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (MoAlN), tantalum silicon nitride (TaSiN), tantalum aluminum nitride (TaAlN), titanium oxide nitride (TiON), titanium aluminum oxide nitride (TiAlON), tungsten oxide nitride (WON) and/or tantalum oxide nitride (TaON).

6. A phase-changeable memory device, comprising:
a phase-changeable material pattern of a phase-changeable material that includes nitrogen atoms; and
first and second electrodes electrically connected to the phase-changeable material pattern and provide an electrical signal thereto;
wherein the phase-changeable material pattern has a polycrystalline structure.

7. The device of claim 6 wherein the polycrystalline structure includes grains of less than about 100 nm in size.

8. A phase-changeable memory device, comprising:
a phase-changeable material pattern of a phase-changeable material that includes nitrogen atoms; and
first and second electrodes electrically connected to the phase-changeable material pattern and provide an electrical signal thereto;
wherein the phase-changeable material pattern comprises Ge—Sb—Te—N, As—Sb—Te—N, As—Ge—Sb—Te—N, Sn—Sb—Te—N, In—Sn—Sb—Te—N, Ag—In—Sb—Te—N, 5A group element-Sb—Te—N, 6A group element-Sb—Te—N, 5A group element-Sb—Se—N, and/or 6A group element-Sb—Se—N.

9. A phase-changeable memory device, comprising:
a phase-changeable material pattern of a phase-changeable material having a polycrystalline structure; and
first and second electrodes electrically connected to the phase-changeable material pattern to provide an electrical signal thereto;
wherein an amount of nitrogen atoms in the phase-changeable material pattern is from about 0.25% to about 25% with respect to the total atomic weight of ingredients of the phase-changeable material.

10. The device of claim 9 wherein the polycrystalline structure includes grains of less than about 100 nm in size.

11. A phase-changeable memory device, comprising:
a phase-changeable material pattern of a phase-changeable material having a polycrystalline structure; and
first and second electrodes electrically connected to the phase-changeable material pattern to provide an electrical signal thereto;
wherein the phase-changeable material pattern comprises Ge—Sb—Te—N, As—Sb—Te—N, As—Ge—Sb—Te—N, Sn—Sb—Te—N, In—Sn—Sb—Te—N, Ag—In—Sb—Te—N, a 5A group element-Sb—Te—N, a 6A group element-Sb—Te—N, a 5A group element-Sb—Se—N, and/or a 6A group element-Sb—Se—N.

12. A phase-changeable memory device, comprising:
a transistor including a source region, a drain region and a gate electrode disposed on the semiconductor substrate;
a lower interconnection electrically connected to the drain region;
a contact pad formed of the same material and placed on the same height as the lower interconnection;
a variable resistor electrically connected to the contact pad; and
an upper interconnection electrically connected to the variable resistor,
wherein the variable resistor is interposed between the two electrodes and includes nitrogen atoms.

13. The device of claim 12, wherein the phase-changeable material pattern comprises Ge—Sb—Te—N, As—Sb—Te—N, As—Ge—Sb—Te—N, Sn—Sb—Te—N, In—Sn—Sb—Te—N, Ag—In—Sb—Te—N, a 5A group element-Sb—Te—N, a 6A group element-Sb—Te—N, a 5A group element-Sb—Se—N, and/or a 6A group element-Sb—Se—N.

14. The device of claim 12, wherein the variable resistor includes a phase-changeable material pattern having a polycrystalline structure.

15. The device of claim 14, wherein the variable resistor includes a phase-changeable material pattern that includes nitrogen atoms, wherein an amount of the nitrogen atoms is from about 0.25% to about 25% with respect to the total atomic weight of ingredients of the phase-changeable material.

16. The device of claim 12, wherein the variable resistor includes a phase-changeable material pattern that includes nitrogen atoms, wherein an amount of the nitrogen atoms is from about 0.25% to about 25% with respect to the total atomic weight of ingredients of the phase-changeable material.

17. The device of claim 16, wherein the two electrodes comprise a conductive material containing nitrogen, a conductive material containing carbon, titanium, tungsten, molybdenum, tantalum, titanium silicide, tantalum silicide, and/or a combination thereof.

18. The device of claim 12, wherein the first and second electrodes comprise a conductive material containing nitrogen, a conductive material containing carbon, titanium, tungsten, molybdenum, tantalum, titanium silicide, tantalum silicide and/or a combination thereof.

19. The device of claim 18, wherein one of the two electrodes is electrically connected to the contact pad and the other electrode is electrode is electrically connected to the upper interconnection,
wherein the other electrode connected to the top electrode further comprises aluminum (Al), aluminum-copper alloy (Al—Cu), aluminum-copper-silicon alloy (Al—Cu—Si), tungsten silicide (WSi), copper (Cu), tungsten titanium (TiW), and/or a combination thereof.

20. The device of claim 19, wherein the conductive material containing nitrogen comprises titanium nitride (TiN), tantalum nitride (TaN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), silicon aluminum nitride (ZrAlN), molybdenum silicon nitride (MoSiN), molybdenum aluminum nitride (MoAlN), tantalum silicon nitride (TaSiN), tantalum aluminum nitride (TaAlN), titanium oxide nitride (TiON), titanium aluminum oxide nitride (TiAlON), tungsten oxide nitride (WON) and/or tantalum oxide nitride (TaON).

21. A phase-changeable memory device comprising:
a transistor including a source region, a drain region and a gate electrode that are disposed on the semiconductor substrate;
an interlayer dielectric layer formed on the semiconductor substrate to cover the transistor;
a lower interconnection disposed in the interlayer dielectric layer to connect to the drain region electrically;
a contact pad disposed in the interlayer dielectric layer at substantially the same height and formed of the same material as the lower interconnection;
a lower intermetal dielectric layer disposed on the interlayer dielectric layer;

a variable resistor electrically connected to the contact pad;
an upper intermetal dielectric layer disposed on the lower intermetal dielectric layer to cover a side of the variable resistor; and
an upper interconnection disposed in the upper intermetal dielectric layer to connect to the variable resistor electrically,
wherein the variable resistor comprises:
a bottom electrode penetrating a portion of the lower intermetal dielectric layer to electrically connect to the contact pad;
a phase-changeable material pattern containing nitrogen atoms disposed on the lower intermetal dielectric layer and on the bottom electrode; and
a top electrode disposed on the phase-changeable material pattern to electrically connect to the upper interconnection.

22. The device of claim 21, wherein the phase-changeable material pattern has a polycrystalline structure.

23. The device of claim 22, wherein an amount of the nitrogen atoms is about from 0.25% to about 25% with respect to a total atomic weight of ingredients of the phase-changeable material pattern.

24. The device of claim 23, wherein the phase-changeable material pattern comprises Ge—Sb—Te—N, As—Sb—Te—N, As—Ge—Sb—Te—N, Sn—Sb—Te—N, In—Sn—Sb—Te—N, Ag—In—Sb—Te—N, a 5A group element-Sb—Te—N, a 6A group element-Sb—Te—N, a 5A group element-Sb—Se—N, and/or a 6A group element-Sb—Se—N.

25. The device of claim 24, wherein the bottom and top electrodes comprise a conductive material containing nitrogen, a conductive material containing carbon, titanium, tungsten, molybdenum, tantalum, titanium suicide, tantalum silicide, and/or a combination thereof.

26. The device of claim 25, wherein a top surface of the top electrode is lower than a top surface of the upper intermetal dielectric layer, and
further comprising a conductive plug penetrating the intermetal dielectric layer on the top electrode to electrically connect to the upper interconnection,
wherein a diameter of the conductive plug is smaller than a width of the top electrode and the conductive plug comprises aluminum (Al), aluminum-copper alloy (Al—Cu), aluminum-copper-silicon alloy (Al—Cu—Si), tungsten silicide (WSi), copper (Cu), tungsten titanium (TiW), and/or a combination thereof.

27. The device of claim 26, wherein the conductive material containing nitrogen comprises titanium nitride (TiN), tantalum nitride (TaN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), silicon aluminum nitride (ZrAlN), molybdenum silicon nitride (MoSiN), molybdenum aluminum nitride (MoAlN), tantalum silicon nitride (TaSiN), tantalum aluminum nitride (TaAlN), titanium oxide nitride (TiON), titanium aluminum oxide nitride (TiAlON), tungsten oxide nitride (WON) and/or tantalum oxide nitride (TaON).

* * * * *

UNITED STATES PATENT AND TRADEMARK OFFICE
CERTIFICATE OF CORRECTION

PATENT NO. : 7,115,927 B2 Page 1 of 1
APPLICATION NO. : 10/781597
DATED : October 3, 2006
INVENTOR(S) : Horii Hideki and Jeong-hee Park It is certified that error appears in the above-identified patent and that said Letters Patent is hereby corrected as shown below:

In the Claims:

Claim 25 Column 20, line 2 should read as follows: Insert --tungsten, molybdenum, tantalum, titanium silicide, tantalum--

Signed and Sealed this

Twenty-sixth Day of December, 2006

JON W. DUDAS
*Director of the United States Patent and Trademark Office*